(12) United States Patent
Whitman

(10) Patent No.: US 6,395,148 B1
(45) Date of Patent: May 28, 2002

(54) METHOD FOR PRODUCING DESIRED TANTALUM PHASE

(75) Inventor: Charles Spencer Whitman, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/515,840

(22) Filed: Feb. 29, 2000

Related U.S. Application Data

(63) Continuation-in-part of application No. 09/186,904, filed on Nov. 6, 1998, now Pat. No. 6,142,612.

(51) Int. Cl.[7] .............................................. C23C 14/34
(52) U.S. Cl. ......................... 204/192.15; 204/192.17; 204/192.3; 204/192.32; 216/27; 347/61
(58) Field of Search .................... 216/27; 347/61; 204/192.15, 192.17, 192.21, 192.3, 192.32, 192.35, 192.37

(56) References Cited

U.S. PATENT DOCUMENTS

| | | | |
|---|---|---|---|
| 3,275,915 A | | 9/1966 | Harendza-Harinxma |
| 3,607,679 A | | 9/1971 | Melroy et al. |
| 3,641,402 A | | 2/1972 | Revitz et al. |
| 3,723,838 A | * | 3/1973 | Kumagai ................ 317/258 |
| 4,000,055 A | | 12/1976 | Kumagai |
| 4,058,445 A | | 11/1977 | Anders |
| 4,251,326 A | | 2/1981 | Arcidiacono et al. |
| 4,364,099 A | | 12/1982 | Koyama et al. |
| 4,632,883 A | | 12/1986 | Howard et al. |
| 4,936,952 A | * | 6/1990 | Komuro ..................... 216/27 |
| 4,968,992 A | * | 11/1990 | Komuro ..................... 347/63 |
| 5,062,937 A | * | 11/1991 | Komuro ................ 204/192.15 |
| 5,063,655 A | * | 11/1991 | Lamey et al. ................ 29/611 |
| 5,140,403 A | | 8/1992 | Hikichi et al. |
| 5,221,449 A | * | 6/1993 | Colgan et al. ......... 204/192.15 |
| 5,279,980 A | | 1/1994 | Hikichi et al. |
| 5,281,485 A | | 1/1994 | Colgan et al. |
| 6,013,160 A | * | 1/2000 | Raisanen et al. ...... 204/192.15 |
| 6,142,612 A | * | 11/2000 | Whitman ..................... 347/63 |
| 2001/0018137 A1 | * | 8/2001 | Chiang et al. .............. 428/698 |

FOREIGN PATENT DOCUMENTS

| | | |
|---|---|---|
| EP | 498663 A2 | 8/1992 |
| GB | 1141684 | 1/1969 |

* cited by examiner

*Primary Examiner*—Randy Gulakowski
*Assistant Examiner*—Shamim Ahmed
(74) *Attorney, Agent, or Firm*—David E. LaRose; Cynthia S. Mitchell

(57) ABSTRACT

The invention relates to a method for producing improved tantalum conductive and resistive materials for use in ink jet heater chips. Specifically, a method for producing thin film tantalum layers of a desired phase on a semiconductor substrate comprises depositing protective layers upon the semiconductor substrate; pre-sputter etching the semiconductor substrate; preheating the semiconductor substrate; maintaining the substrate at a predetermined temperature while depositing the thin film tantalum layer by sputtering for a predetermined period of time at a predetermined input power. Use of the method enables production of a desired tantalum phase for use on a semiconductor substrate thereby providing enhanced corrosion and/or cavitation resistance depending on the use of the semiconductor device.

18 Claims, 1 Drawing Sheet

METHOD FOR PRODUCING DESIRED TANTALUM PHASE

This application is a continuation-in-part of Ser. No. 09/186,904 filed Nov. 6, 1998 now U.S. Pat. No. 6,142,612 to Whitman issued on Nov. 7, 2000.

FIELD OF THE INVENTION

The invention relates to methods for producing improved tantalum conductive and resistive materials for use in ink jet heater chips.

BACKGROUND OF THE INVENTION

Tantalum thin films are used in a variety of applications associated particularly with electronic equipment. For example, tantalum (Ta) may be used as a diffusion barrier between copper and silicon, a gate electrode in MOSFET's, as an x-ray absorber in x-ray masks and as a protective overcoat above the resistors in thermal printheads for ink jet printing devices. Tantalum is typically sputter deposited as a mixture of two phases, namely alpha phase tantalum and beta phase tantalum. Beta phase tantalum has a tetragonal structure and is relatively harder and exhibits a much higher resistivity than the alpha phase which has a body-centered cubic structure and relatively lower resistivity.

A printhead for a thermal ink jet printing device usually contains a silicon substrate having conductive and resistive layers deposited thereon to provide electrical features which are used to heat and eject ink from the printheads. The ink jet ink may be corrosive to the various conductive and resistive layers deposited on the surface of the silicon. Accordingly, protective layers such as silicon dioxide and additional passivation layers of silicon carbide and/or silicon nitride are typically used in conjunction with the resistive and conductive layers. Deposition of each of the conductive, resistive and protective layers is generally conducted sequentially using a variety of deposition techniques. Each layer typically requires its own unique set of conditions for optimal deposition of the desired material. Once the layer is deposited, it may be subjected to patterning and/or etching steps to further define the characteristics of the layers and to provide a desired interconnection between certain layers. Each of the deposition, patterning and etching steps is time consuming and thus effects product throughput.

There is an ongoing need for improved manufacturing techniques for production of electronic components for thermal ink jet printheads.

SUMMARY OF THE INVENTION

With regard to the foregoing and other objects and advantages, the invention provides a method for producing a thin film tantalum layer of a desired phase for use in an ink jet printhead. The method comprises selecting a semiconductor substrate suitable for deposition of resistive, conductive, and protective layers thereon. The substrate is preferably etched prior to the deposition of the tantalum layer of the desired phase for a predetermined period of time. The substrate is then preferably heated at a selected temperature for a predetermined amount of time. The substrate may then be further heated or cooled to reach a desired substrate temperature suitable for sputtering the thin film tantalum layer of the desired phase. The substrate is maintained at the predetermined substrate temperature during the deposition of the tantalum film while the sputtering power is maintained at a predetermined input power level for a predetermined period of sputter time. The predetermined temperatures, times, and powers (collectively the factors) are selected in accordance with a mathematical relationship between the factors in order to produce the desired phase of tantalum in the tantalum thin film layer. The mathematical relationship between the factors is a regression equation that predicts the tantalum layer thickness, the tantalum layer sheet resistance, and the percentage of beta phase in the tantalum layer.

In another aspect, the invention provides a heater chip for use in an ink jet printhead comprising a semiconductor substrate wherein resistive, conductive, and protective layers are deposited thereon. The resistive, conductive, and protective layers may comprise thin film tantalum layers of a desired phase.

An advantage of the invention is that it provides a method for consistently producing thin film tantalum layers of a desired phase such that the tantalum thin films can be used for alternative applications such as conductors, resistors and cavitation resistant layers. Another advantage of the invention is that it provides a method for reducing production steps when manufacturing heater chips for use in an ink jet printer since pure phase tantalum films can be used instead of tantalum alloys. Another advantage of the invention is that it provides a method for reducing costs when manufacturing heater chips for use in an ink jet printer.

A further advantage of the invention is that it provides a method for producing thin film alpha phase tantalum conductors which can provide increased resistance to ink corrosion thereby extending the life of an ink jet printhead. Another advantage of the invention is that it provides a method for producing thin film tantalum overcoat layers of a desired phase which is suitable for enhancing cavitation resistance for a particular ink thereby increasing the life of an ink jet heater chip.

BRIEF DESCRIPTION OF THE DRAWINGS

Further advantages of the invention will become apparent by reference to the detailed description when considered in conjunction with the figures, which are not to scale, wherein like reference numbers indicate like elements, and wherein.

DETAILED DESCRIPTION OF A PREFERRED EMBODIMENT

The invention provides a method for producing a thin film tantalum layer of a desired phase on a semiconductor substrate for use in ink jet heater chips. In a preferred embodiment, the semiconductor substrate comprises a silicon wafer 10. The thickness of the substrate may vary depending on the specific application and may be readily determined from those skilled in the art. A preferred silicon wafer thickness may range from about 605 microns to about 645 microns.

Figure 1:
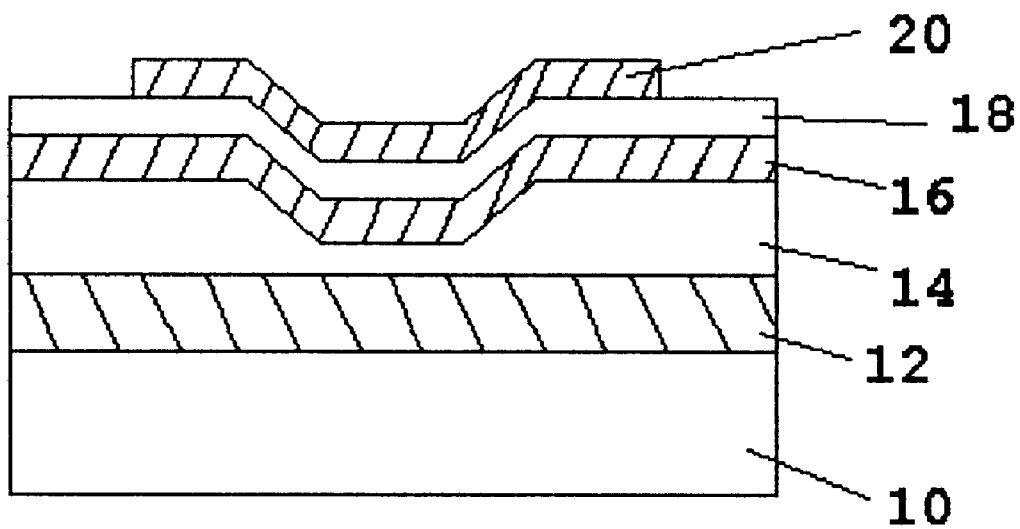
FIG. 1 is a cross-sectional view of a heater chip wherein both alpha and beta phase tantalum layers have been deposited.

Protective layers are preferably deposited on the semiconductor substrate prior to depositing resistive and conductive layers. The protective layers, as shown in FIG. 1, preferably comprise a thermal oxide layer 12, a silicon nitride layer 16, and/or a silicon carbide layer 18. The thickness of each protective layer may vary depending on the specific heater chip. The thickness of the thermal oxide layer 12 will generally range from about 1035 nm to 1265 nm. The oxide layer 12 is preferably grown by a thermal process in the presence of oxygen, although any method known to those skilled in the art may be used to provide oxide layer 12. The silicon nitride layer 16 generally has a thickness ranging from about 390 nm to about 490 nm. The silicon nitride layer 16 is preferably deposited by plasma enhanced chemical vapor deposition (PECVD). The thickness of the silicon carbide layer 18 will generally range from about 230 nm to about 290 nm. Preferably, the silicon carbide layer 18 is deposited by PECVD. Other suitable methods for depositing the silicon nitride layer 16 and the silicon carbide layer 18 may be used depending on the specific application.

The thin film tantalum layers are preferably produced using equipment such as a vacuum deposition device such as a device available from Varian Vacuum Technologies of Lexington, Mass. under the trade name VARIAN 3290. Other devices which may be used include a vacuum deposition device available from Varian Vacuum Technologies under the trade name VARIAN 3190, sputter coaters available from Tokyo Electron America, Inc. of Austin, Tex. under the trade names The ECLIPSE STAR, The ECLIPSE MARK II, The ECLIPSE MARK IV, and sputter coaters available from Applied Materials, Inc. of Santa Clara, Calif. under the trade name ENDURA.

The substrate is preferably etched for a predetermined period of time prior to sputtering of the tantalum layer or layers thereon. Preferably, the pre-sputter etch time ranges from about 0 to about 400 seconds. The pre-sputter etch step is accomplished using an inert gas at a substantially constant pressure and a substantially constant voltage. In a preferred embodiment, argon is used at about 7 millitorr and about −1300 volts. The pre-sputter etch step may be used to form vias through the layers on the substrate to connect with the tantalum layer, to improve adhesion between a protective layer and the tantalum layer, or for any other purpose desirable for the specific application.

After the pre-sputter etch step, the substrate is preferably heated for a predetermined period of time at a selected temperature. In a preferred embodiment, the semiconductor substrate is heated at a substantially constant temperature of about 250° C. Preferably, the preheat time ranges from about 0 to about 400 seconds. Heating of the substrate may be accomplished by any known method suitable for manufacturing such a device. If the desired substrate temperature for sputtering the tantalum layer is greater than the selected preheat temperature, additional heating may be necessary to heat the substrate to the desired temperature for sputtering. If the desired substrate temperature for sputtering is lower than the preheat temperature, additional time may be required to cool the substrate prior to sputtering. However, the tantalum layer may be sputtered onto the substrate without any cooling time for the substrate in order to increase throughput in a manufacturing environment. In a preferred embodiment, the substrate temperature for sputtering ranges from 25° C. to 400° C. The substrate temperature during sputtering is believed to have the greatest effect on tantalum phase composition. Generally, lower temperatures encourage the formation of beta phase tantalum and higher temperatures encourage the formation of alpha phase tantalum. However, it may be undesirable to place the substrate in high temperatures for specific applications while other factors may be varied to compensate for a low substrate temperature.

The substrate is preferably maintained at the desired temperature during the step of depositing the tantalum layer of the desired phase. The tantalum layer of the desired phase is deposited on the substrate by sputtering for a predetermined amount of time. In a preferred embodiment, the sputtering time ranges from about 20 to about 400 seconds. The input power is preferably maintained at a predetermined input power level throughout the sputtering step. Preferably, the input power ranges from about 0.6 to about 4 kilowatts.

The sputter time and input power have a significant influence on film thickness; therefore, these factors may be selected in order to produce a desired film thickness for a given application. In a preferred embodiment, the base pressure for deposition is $2 \times 10^{-7}$ Torr and the sputtering occurs in a chamber which has been back filled with argon to a pressure of 3 millitorr.

The desired phase of tantalum, a desired thickness, or a desired sheet resistance is produced by predetermining the pre-sputter etch time, the preheat time, the substrate temperature during sputtering, the input power for sputtering, and the sputtering time in accordance with a regression equation of the form:

$$Y = b_0 + b_1 x_1 + b_2 x_2 + b_3 x_3 + b_4 x_4 + b_5 x_5 + b_{12} x_1 x_2 + b_{13} x_1 x_3 + b_{14} x_1 x_4 + b_{15} x_1 x_5 + b_{23}$$

$$x_2 x_3 + b_{24} x_2 x_4 + b_{25} x_2 x_5 + b_{34} x_3 x_4 + b_{35} x_3$$

$$x_5 + b_{45} x_4 x_5 + b_{11} x_1^2 + b_{22} x_2^2 + b_{33} x_3^2 + b_{44} x_4^2 + b_{55} x_5^2.$$

In the equation, Y represents one or more of the desired properties of the tantalum layer, the b's are regression coefficients and the x's are factor levels ranging from −1 to +1. Y may represent either the percentage of beta phase tantalum, the film thickness, or the sheet resistance. If the percentage of beta phase is zero, then one hundred percent alpha phase tantalum is formed. Similarly, if the percentage of beta phase is five percent, then the thin film layer is ninety-five percent alpha phase tantalum.

For each of the desired properties of the tantalum layer, the Y values have been transformed and the factors have been coded. The actual or desired film thickness, in angstroms, is transformed for substitution into the regression equation by taking the square root of the actual or desired film thickness. The actual or desired sheet resistance is transformed for substitution into the regression equation by taking the natural log of the actual or desired sheet resistance. The percentage of beta phase is transformed using the equation:

transformed beta phase percentage=2×arc sin(beta phase percentage$^{0.5}$).

Therefore, in order to determine the correct factor levels for a desired property, the response must be transformed before substituting the value for Y in the regression equation. Similarly, if desired factor levels are inserted into the regression equation, the resulting response must be transformed in order to determine the actual predicted value of the response. For film thickness, the calculated response would be squared in order to determine the actual predicted response for film thickness, in angstroms. A predicted sheet resistance is equal to the exponential of the transformed predicted sheet resistance using the equation:

Predicted Sheet Resistance=exp(transformed predicted sheet resistance)

The transformed percentage beta phase calculated from the regression equation can be converted to the actual predicted beta phase percentage using the following equation:

Predicted Percentage beta phase=(sin(0.5×transformed predicted beta phase))².

The factor levels should also be coded prior to being used in the regression equation. The factor levels may be coded using the equation:

coded value=(uncoded value−(min+max)/2)/((max−min)/2).

The "min" and "max" are the minimum and maximum levels for a given factor. In a preferred embodiment, the min and max for each factor would be ends of the given ranges: 0 and 400 seconds for pre-sputter etch time; 0 and 400 seconds for preheat time; 25° C. and 400° C. for substrate temperature during sputtering; 0.6 and 4 kilowatts for input power; and 20 and 400 seconds for sputtering time.

The coded factor levels may be assigned the proper values in the regression equation by assigning $x_1$ through $x_5$ as the factors. For example, $x_1$ could be the coded value for sputtering time, $x_2$ could be the coded value for input power, $x_3$ could be the coded value for pre-sputter etch time, $x_4$ could be the coded value for preheat time, and $X_5$ would be the coded value for substrate temperature. The regression coefficients would correspond to the coded factors such that in this example $b_1$ would be the coefficient for sputtering time while $b_2$ would be the coefficient for input power, $b_3$ would be the coefficient for pre-sputter etch time, $b_4$ would be the coefficient for preheat time, and $b_5$ would be the coefficient for substrate temperature. For this example, coefficients such as $b_{11}$ would be listed in the table as sputtering time² and coefficients such as $b_{12}$ would be found in the table as (sputtering time×input power). The intercept is assigned as $b_0$ in the regression equation. The corresponding coefficients are listed in the following table of regression coefficients to demonstrate the relationship between the factors and the coefficients as described in the above example.

In order to determine a desired response or an appropriate factor level to produce a desired response, the regression coefficients given in Table 1 are preferably used in the given regression equation for each response:

TABLE 1

| Name of Regression Coefficient | Corresponding Coefficient in Regression Equation | Regression Coefficients for Transformed Fraction of Beta Phase | Regression Coefficients for Transformed Thickness | Regression Coefficients for Transformed Sheet Resistance |
|---|---|---|---|---|
| Intercept | $b_0$ | 83.183 | 0.803 | −0.632 |
| Sputtering time | $b_1$ | 41.67 | 0.251 | −1.223 |
| Input power | $b_2$ | 25.703 | 0.0987 | −0.886 |
| Pre-sputter etch time (PSE time) | $b_3$ | −0.619 | −0.0919 | −0.524 |
| Preheat time | $b_4$ | −0.263 | −0.193 | −0.145 |
| Substrate temperature | $b_5$ | −0.331 | −0.741 | −0.08 |
| Sputtering time * Input power | $b_{12}$ | 16.111 | −0.011 | −0.315 |
| Sputtering time * PSE time | $b_{13}$ | 0.232 | −0.122 | 0.506 |
| Sputtering time * Preheat time | $b_{14}$ | 2.39 | 0.00434 | −0.143 |
| Sputtering time * Substrate temperature | $b_{15}$ | 0.746 | −0.236 | −0.751 |
| Input power * PSE time | $b_{23}$ | 1.347 | 0.0162 | 0.333 |
| Input power * | $b_{24}$ | 1.378 | −0.0877 | −0.232 |
| Preheat time | | | | |
| Input power * Substrate temperature | $b_{25}$ | 0.081 | −0.201 | −0.331 |
| PSE time * Preheat time | $b_{34}$ | −2.058 | 0.0271 | −0.267 |
| PSE time * Substrate temperature | $b_{35}$ | 0.66 | 0.0504 | 0.369 |
| Preheat time * Substrate temperature | $b_{45}$ | 2.13 | 0.158 | 0.173 |
| Sputtering time² | $b_{11}$ | −11.435 | −0.11 | 0 |
| Input power² | $b_{22}$ | −7.236 | −0.342 | 0.65 |
| PSE time² | $b_{33}$ | 0.772 | 0.167 | 0 |
| Preheat time² | $b_{44}$ | 2.164 | 0.0234 | 0 |
| Substrate temperature² | $b_{55}$ | −2.643 | 0.183 | 0 |

The regression coefficients are experimental values derived from a series of trials which varied the five factors: pre-sputter etch time; preheat time; substrate temperature during sputtering; input power for sputtering; and sputtering time. These factors are represented by $x_1$ through $x_5$ in the regression equation. In the experimental trials, the five factors were varied simultaneously in order to determine the individual effects of the factors and the effects of the factor interactions.

A computer generated I-Optimal experimental design was used to determine the levels of the factors to be used in the trials. A polynomial model was used which included the five factors, ten two factor interactions, five squared terms, one for each factor, and an intercept. The resulting polynomial model is the given regression equation. The computer algorithm chose twenty-seven trials with specific values for all five factors for each trial. The computer algorithm chose the specific values for the experimental trials by selecting factor values which minimized the average variance of the predicted response. Interactions between three or more factors were assumed to be negligible.

The experimental trials were performed in a Varian 3290 vacuum deposition device in a random order. The first, thirteenth, and twenty-fourth trials used identical factor values. The base pressure in the 3290 was $2\times10^{-7}$ Torr and the sputtering was performed after back filling with Argon to a pressure of 3 mTorr. The pre-sputter etch was performed at 7 mTorr. All the trials were performed separately using silicon wafers with a thin film stack comprising a thermal oxide layer having a thickness of approximately 600 nm, a silicon nitride layer having a thickness of approximately 440 nm, and a silicon carbide layer having a thickness of approximately 260 nm. Prior to each trial, at least three wafers were run before the actual experimental wafers in order to remove contamination from the tantalum target. Each trial run consisted of at least two wafers.

Since the Varian 3290 vacuum deposition device has four stations in the same chamber, each station was used to hold one wafer. At the first station, the pre-sputter etch was performed at −1300 V. The second and third stations were used for preheat and the selected preheat temperature of 250° C. was achieved using argon heating. The Varian 3290 vacuum deposition device has an argon delay so that the preheat could be delayed if necessary so that all four stations finished simultaneously. The fourth station was used for the sputtering. Prior to sputtering, the wafer was heated for ten seconds to bring the wafer to the desired substrate temperature for sputtering. The wafer did not have any additional time to cool even if the desired sputtering temperature was lower than the selected preheat temperature. In a manufacturing environment, such a process is believed to increase throughput.

Three responses were observed from the trials: film thickness; sheet resistance; and percentage beta phase. Film thickness was measured at the center of the wafer using an angle lap technique. Sheet resistance was measured using a four point probe and x-ray diffraction was used to determine the phase composition.

Figure 2:
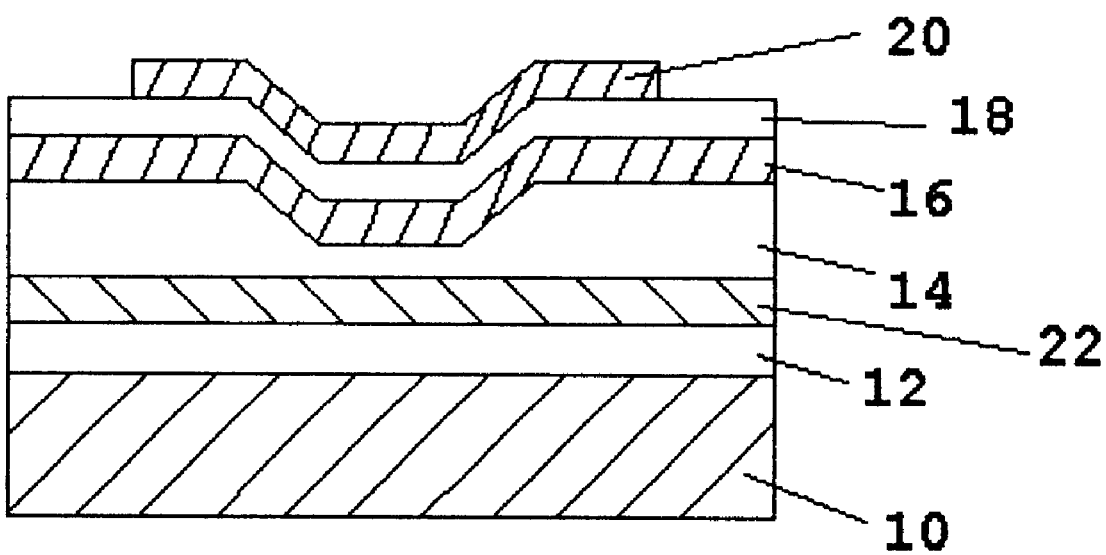
FIG. 2 is a cross-sectional view of a heater chip wherein both alpha and beta phase tantalum layers have been deposited on a silicon carbide layer.

The following table shows the factor levels and the measured responses for each of the twenty-seven trials. The measured responses for each of the trials in Table 2 was provided as average values for at least two wafers and for as many as 6 wafers at each set of conditions.

above disclosed method. Preferably, a silicon nitride layer 16 and a first silicon carbide layer 18 are then deposited on the thin film alpha phase tantalum layer 14. In the preferred embodiment, a cavitation resistance layer 20 of alpha or beta phase tantalum is deposited onto the silicon carbide layer 18 in accordance with the method disclosed above. In an alternative embodiment, a second silicon carbide layer 22 is deposited onto the thermal oxide layer 12 as shown in FIG. 2. In this alternative embodiment, the thin film alpha phase tantalum layer 14 is deposited onto the second silicon carbide layer 22 and then the silicon nitride layer 16 and first silicon carbide layer 18 are deposited. The cavitation resistance layer 20 of alpha or beta phase tantalum is then deposited on the first silicon carbide layer 18.

Alternatively, the composition and number of protective layers may be varied depending on the specific heater chip application. The thickness of the protective layers and of the tantalum layers may also be varied depending on the specific application. The desired thickness of the tantalum films may be obtained by determining the proper values of the factors in the regression equation for the desired phase of tantalum.

TABLE 2

| Trial No. | Sputtering Time (s) | Input Power (kW) | PSE Time (s) | Preheat Time (s) | Substrate Temperature (° C.) | Average Film Thickness (nm) | Average Resistance (Ω/sq.) | Average % Beta |
|---|---|---|---|---|---|---|---|---|
| 1 | 224 | 2.2 | 206 | 179 | 218 | 734 | 0.49 | 18.6 |
| 2 | 20 | 1.9 | 400 | 277 | 25 | 47 | 17.1 | 30 |
| 3 | 400 | 3.6 | 400 | 24 | 400 | 1937 | 0.1 | 0 |
| 4 | 20 | 2.7 | 0 | 0 | 400 | 88 | 3.9 | 2.5 |
| 5 | 400 | 0.7 | 400 | 0 | 106 | 423 | 1.3 | 43.6 |
| 6 | 400 | 4 | 0 | 0 | 175 | 2144 | 0.115 | 48.7 |
| 7 | 400 | 0.6 | 400 | 358 | 400 | 409 | 0.51 | 0 |
| 8 | 400 | 4 | 265 | 293 | 25 | 1995 | 0.22 | 71.6 |
| 9 | 214 | 0.6 | 219 | 400 | 25 | 211 | 1.75 | 17.2 |
| 10 | 400 | 2.3 | 0 | 400 | 231 | 1446 | 0.18 | 22.1 |
| 11 | 20 | 0.6 | 160 | 0 | 25 | 46 | 61 | 14.5 |
| 12 | 20 | 4 | 236 | 114 | 246 | 106 | 2.6 | 0.4 |
| 13 | 224 | 2.2 | 206 | 179 | 218 | 722 | 0.41 | 16.8 |
| 14 | 20 | 4 | 0 | 400 | 25 | 120 | 3.5 | 14.6 |
| 15 | 66 | 0.6 | 400 | 24 | 400 | 70 | 4.1 | 0 |
| 16 | 385 | 0.6 | 86 | 0 | 400 | 367 | 0.54 | 0 |
| 17 | 164 | 4 | 400 | 0 | 25 | 846 | 0.76 | 74.3 |
| 18 | 400 | 0.6 | 0 | 181 | 25 | 401 | 2.8 | 72.9 |
| 19 | 20 | 2.4 | 222 | 400 | 400 | 69 | 4.2 | 0.7 |
| 20 | 197 | 2.4 | 0 | 75 | 25 | 664 | 1.5 | 83.8 |
| 21 | 20 | 0.6 | 0 | 293 | 274 | 26 | 20.1 | 0 |
| 22 | 255 | 4 | 0 | 277 | 400 | 1333 | 0.15 | 0 |
| 23 | 199 | 4 | 400 | 400 | 234 | 1089 | 0.2 | 0.7 |
| 24 | 224 | 2.2 | 206 | 179 | 218 | 671 | 0.41 | 22.1 |
| 25 | 400 | 1.5 | 300 | 100 | 25 | 911 | 0.54 | 48.7 |
| 26 | 163 | 4 | 50 | 250 | 353 | 684 | 0.31 | 0 |
| 27 | 400 | 1 | 0 | 0 | 25 | 625 | 2.2 | 93.1 |

A commercially available statistical software package such as the software package available from Process Builder, Inc. of Seattle, Wash. under the trade name STRATEGY was used to develop an empirical model to predict the three responses by determining the regression coefficients in accordance with the results of the trials. The regression coefficients were then substituted into the regression equation in order to predict a desired response of film thickness, sheet resistance, or percentage of beta phase tantalum.

Referring to FIG. 1, the method for producing the thin film tantalum layer of the desired phase may be used to construct heater chips for use in inkjet printheads. Preferably, the semiconductor substrate is a silicon wafer 10 and the first protective layer is a thermal oxide layer 12. In a preferred embodiment, a thin film of alpha phase tantalum 14 is then deposited onto the thermal oxide layer using the It is contemplated, and will be apparent to those skilled in the art from the foregoing specification, drawings, and examples, that modifications and/or changes may be made in the embodiments of the invention. Accordingly it is expressly intended that the foregoing are only illustrative of the preferred embodiments, not limiting thereto, and that the true spirit and scope of the present invention be determined by reference to the appended claims.

What is claimed is:

1. A method for producing a thin film tantalum layer having a desired tantalum phase on a semiconductor substrate for use in an ink jet printhead which comprises:

depositing one or more protective layers on the semiconductor substrate;

pre-sputter etching the semiconductor substrate for a predetermined period of pre-sputter etch time using an inert gas at a substantially constant pressure and a substantially constant voltage;

preheating the semiconductor substrate at a selected preheat temperature for a predetermined amount of preheat time;

heating the semiconductor substrate to a predetermined substrate temperature suitable for depositing the thin film tantalum layer having the desired tantalum phase thereon; and maintaining the substrate at the predetermined substrate temperature while depositing the thin film tantalum layer on the substrate wherein sputtering input power is maintained at a predetermined input power level for a predetermined period of sputter time and wherein the predetermined temperatures, times and powers comprise factors selected in accordance with a mathematical relationship between the factors in order to produce the desired tantalum phase in the thin film tantalum layer, wherein the mathematical relationship between the factors comprises a regression equation of the form:
$Y = b_0 + b_1 x_1 + b_2 x_2 + b_3 x_3 + b_4 x_4 + b_5 x_5 + b_{12} x_1 x_2 + b_{13} x_1 y_3 + b_{14} x_1 x_4 + b_{15} x_1 x_5 + b_{23} x_2 x_3 + b_{24} x_2 x_4 + b_{25} x_2 x_5 + b_{34} x_3 x_4 + b_{35} x_3 x_5 + b_{45} x_4 x_5 + b_{11} x_1^2 + b_{22} x_2^2 + b_{33} x_3^2 + b_{44} x_4^2 + b_{55} x_5^2$, wherein Y represents one or more desired properties of the tantalum layer, the b's are regression coefficients and the x's are factor levels ranging from −1 to +1.

2. The method of claim 1 wherein Y comprises tantalum layer film thickness.

3. The method of claim 1 wherein Y comprises tantalum layer sheet resistance.

4. The method of claim 1 wherein Y comprises the percentage of beta phase tantalum in the tantalum layer.

5. The method of claim 1 wherein the predetermined sputter time ranges from about 20 to about 400 seconds.

6. The method of claim 1 wherein the predetermined preheat time ranges from about 0 to about 400 seconds.

7. The method of claim 1 wherein the predetermined pre-sputter etch time ranges from about 0 to about 400 seconds.

8. The method of claim 1 wherein the predetermined input power ranges from about 0.6 to about 4 kilowatts.

9. The method of claim 1 wherein the predetermined substrate temperature during sputtering ranges from about 25° C. to about 400° C.

10. The method of claim 1 wherein the selected preheat temperature for the substrate is about 250° C.

11. The method of claim 1 wherein the semiconductor substrate comprises a silicon wafer.

12. The method of claim 1 wherein the protective layers comprise a thermal oxide layer having a thickness ranging from about 1035 to about 1265 nanometers, a silicon nitride layer having a thickness ranging from about 390 to about 490 nanometers, and a silicon carbide layer having a thickness ranging from about 230 to about 290 nanometers.

13. The method of claim 1 wherein the inert gas used during pre-sputter etching is argon.

14. The method of claim 12 wherein the constant pressure during pre-sputter etching is about 7 millitorr.

15. The method of claim 12 wherein the constant voltage during pre-sputter etching is about −1300 volts.

16. A heater chip for use in an ink jet printhead made in accordance with the method of claim 1.

17. The heater chip of claim 16 wherein the chip comprises a silicon wafer, a thermal oxide layer, an alpha phase tantalum layer, a silicon nitride layer, a silicon carbide layer and a beta phase tantalum layer.

18. The heater chip of claim 16 wherein the chip comprises a silicon wafer, a thermal oxide layer, a first silicon carbide layer, an alpha phase tantalum layer, a silicon nitride layer, a second silicon carbide layer and a beta phase tantalum layer.

* * * * *